US005455779A

United States Patent [19]

Sato et al.

[11] Patent Number: 5,455,779

[45] Date of Patent: Oct. 3, 1995

[54] NOISE REDUCTION APPARATUS

[75] Inventors: Noriharu Sato, Tokyo; Hiroyuki Saito, Katsuta; Satoshi Hasegawa, Yamato; Osamu Igarashi, Isehara, all of Japan

[73] Assignees: Hitachi, Ltd.; Nissan Motor Co., Ltd., both of Japan

[21] Appl. No.: 369,262

[22] Filed: Jan. 5, 1995

Related U.S. Application Data

[63] Continuation of Ser. No. 940,302, Sep. 3, 1992, abandoned.

[30] Foreign Application Priority Data

Sep. 5, 1991 [JP] Japan .................................... 3-225763

[51] Int. Cl.$^6$ ................................ H03F 1/26; H04R 3/02

[52] U.S. Cl. ........................... 364/574; 364/508; 381/71; 381/73.1; 381/94

[58] Field of Search .................................... 364/508, 574; 381/71, 73.1, 94

[56] References Cited

U.S. PATENT DOCUMENTS

| | | | |
|---|---|---|---|
| 5,010,576 | 4/1991 | Hill | 381/71 |
| 5,029,218 | 7/1991 | Nagayasu | 381/71 |
| 5,105,377 | 4/1992 | Ziegler, Jr. | 381/71 |
| 5,111,507 | 5/1992 | Nakaji | 381/71 |
| 5,119,902 | 6/1992 | Geddes | 381/71 |
| 5,140,640 | 8/1992 | Graupe et al. | 381/71 |

FOREIGN PATENT DOCUMENTS

| | | |
|---|---|---|
| 0465174 | 8/1992 | European Pat. Off. . |
| 3908881 | 3/1989 | Germany . |
| 4042116 | 12/1990 | Germany . |
| 4-11291 | of 0000 | Japan . |
| 2203016 | of 0000 | United Kingdom . |
| 2126837 | 3/1984 | United Kingdom . |
| 2149614 | 6/1985 | United Kingdom . |

OTHER PUBLICATIONS

McCosh, Dan, "Anti–Noise Noises", *Popular Science,* V233, p. 17(2), Jul. 1988.

Denenberg, Jeffrey, "Anti–Noise: Quieting the Environment with Active Noise Cancellation Technology", *IEEE Potentials,* Apr. 1992, vol. 11, No. 2, pp. 36–40.

*Primary Examiner*—Ellis B. Ramirez
*Assistant Examiner*—Kyle J. Choi
*Attorney, Agent, or Firm*—Evenson, McKeown, Edwards & Lenahan

[57] ABSTRACT

When noise is caused by the mechanical vibration propagated from the engine, the microprocessor calculates from the vibration frequency of the engine the secondary sound signal which is in antiphase with the noise and which is thus able to cancel out the noise, and supplies it to the loudspeaker which then emanates the secondary sound according to this signal. At this time,the divergence detection circuit monitors the incoming secondary sound signal, and when the secondary sound signal is remarkably increased, it decides that the noise is increased, and automatically stops the secondary sound output from the loudspeaker. Therefore, it can be prevented that the noise is reversely increased by the secondary sound.

11 Claims, 7 Drawing Sheets

NOISE REDUCTION APPARATUS

This application is a continuation of application Ser. No. 07/940,302, filed on Sep. 3, 1992 now abandoned.

BACKGROUND AND SUMMARY OF THE INVENTION

This invention relates to a noise reduction apparatus for reducing the noise that is caused by the propagation of periodical mechanical vibrations, by generating the sound waves which are calculated from the frequencies of the mechanical vibrations so as to be in antiphase with the noise waves and hence to actively cancel out the noise, and more particularly to a noise reduction apparatus suited to avoid the increase of the noise when the noise reduction effect cannot be obtained.

When a mechanical vibration source is periodically vibrating in the neighborhood, noise is generated by the propagation of the mechanical vibration. Automobiles and vessels have engines which act as the periodical mechanical vibration sources, and the vibrations of the wings of airplanes also act as the periodical mechanical vibration sources. This noise depends on the frequencies of the mechanical vibrations, and thus the frequencies of the noise can be known. However, since the ceilings, floors, walls, windows or others of the cabins of cars, vessels and so on can be resonated by the propagated mechanical vibrations, it is often not known where the actual noise comes from. Thus, a noise reduction apparatus has been developed for cancelling out the noise. According to this apparatus, secondary sound waves which are in antiphase with the noise are determined from the frequencies of the mechanical vibrations and the spatial acoustic transfer function of the cabin or the like, and the secondary sound waves are emanated within the cabin so as to cancel out the noise.

FIG. 1 shows a schematic block diagram of the noise reduction apparatus. This noise reduction apparatus includes microphones 4 for detecting the sound pressures at a plurality of locations within a noise space such as a cabin, a plurality of loudspeakers 5 for emanating secondary sound waves within the noise space, and a controller 3 having a microprocessor 2 as computation means. When mechanical vibrations are propagated from an engine 1 to a cabin or the like, noise is generated within the cabin by the mechanical vibrations. The microprocessor 2 considers the spatial acoustic transfer function of the noise space and calculates the secondary sound waves for actively cancelling out the noise from the mechanical vibration frequencies. The secondary sound waves are emanated from the loudspeakers 5 within the cabin, thereby reducing the noise within the cabin. At this time, the microprocessor 2 utilizes, for example, the least mean square algorithm (hereinafter, called the LMS algorithm) as a kind of the saddle point method, and calculates the secondary sound waves which are to be emanated from the loudspeakers 5 in order that the reverberant sound within the cabin which is detected by the microphones 4 can be minimized to be converged, not diverged.

There is a published in UK Patent Application Gazette No. 2149614A and a Japanese Patent Publication No. 1-501344, associated with the above-mentioned prior art.

In the above-mentioned noise reduction apparatus, while the secondary sound waves are being emanated for cancelling out the noise, the power supply is maintained to be in the on-state so that the noise reduction control function is always active. However, it has been found that during the operation of the noise reduction apparatus, the spatial acoustic transfer function between the microphones and the loudspeakers changes drastically. If, for example, the room temperature or the temperature outside the room or cabin is suddenly changed, the noise reducing effect disappears due to, for example, the change of the characteristics of the microphones with the change of temperature or the change of the air density within the cabin, with the result that the noise is reversely increased by the secondary sound emanation. It is troublesome for a crew-member or others to switch off the noise reduction apparatus each time the noise is increased. In addition, it is too late that after the noise is increased, the noise reduction apparatus is switched off by a crew-member or others, or the specially provided noise reduction apparatus becomes useless in that case. In order to widely spread the noise reduction apparatus, it is necessary to solve this problem.

Accordingly, it is an object of the invention to provide a noise reduction apparatus capable of preventing the noise from increasing by the secondary sound emanation even if the spatial acoustic transfer function of the noise space changes drastically.

The above object of the invention can be achieved by providing a noise reduction apparatus having noise detection means for detecting the noise generated by the propagation of a mechanical vibration, a digital computer for calculating from the frequency of the mechanical vibration the secondary sound which is opposite in phase to the noise, a D/A converter for converting the digital signal of the secondary sound calculated by the digital computer into an analog signal, a power amplifier for amplifying the analog signal produced from the D/A converter, and secondary sound generating means for generating secondary sound according to the analog signal amplified by the power amplifier and thereby cancelling out the noise to reduce the noise, wherein divergence detection means is further provided for monitoring the value of the digital signal and, when the value of the digital signal is shifted out of a normal value range, automatically interrupting the secondary sound emanation from the secondary sound generating means or for monitoring the value of the analog signal produced from the D/A converter and, when the value of the analog signal is shifted out of the normal value range, automatically interrupting the secondary sound emanation from the secondary sound generating means or for monitoring the analog signal produced from the power amplifier and, when the value of the analog signal is shifted out of the normal value range, automatically interrupting the secondary sound emanation from the secondary sound generating means.

When the noise is predicted to be increased by the emanation of the secondary sound, the divergence detection means automatically stops the generation of the secondary sound. Therefore, the noise can be satisfactorily reduced, and the persons within the cabin would not be annoyed by the increase of the noise.

DESCRIPTION OF THE PREFERRED EMBODIMENTS

One embodiment of the invention will be described with reference to the accompanying drawings.

In a machine (an automobile, airplane and so on) having a power source such as an internal combustion engine, the piston and connecting rod within the power source usually reciprocate at the same frequency as the combustion cycle of the power source, thereby rotating the power source driving axle. The reciprocating motion of the piston and so on is an unbalanced force, and propagates as the mechanical vibration of the power source to other places of the machine, causing noise. The frequency of this noise is the same as the combustion cycle of the power source, or twice the frequency of the rotation of the driving axle. In the recent machine having a high-performance engine, since the common rotation speed range of the engine is 600 rpm to 7500 rpm, the frequencies of the noise are 20 Hz to 250 Hz. When the above mechanical vibrations are propagated to a resonant place where resonance occurs within this range of frequencies, particularly boisterous noise is caused.

Figure 1:
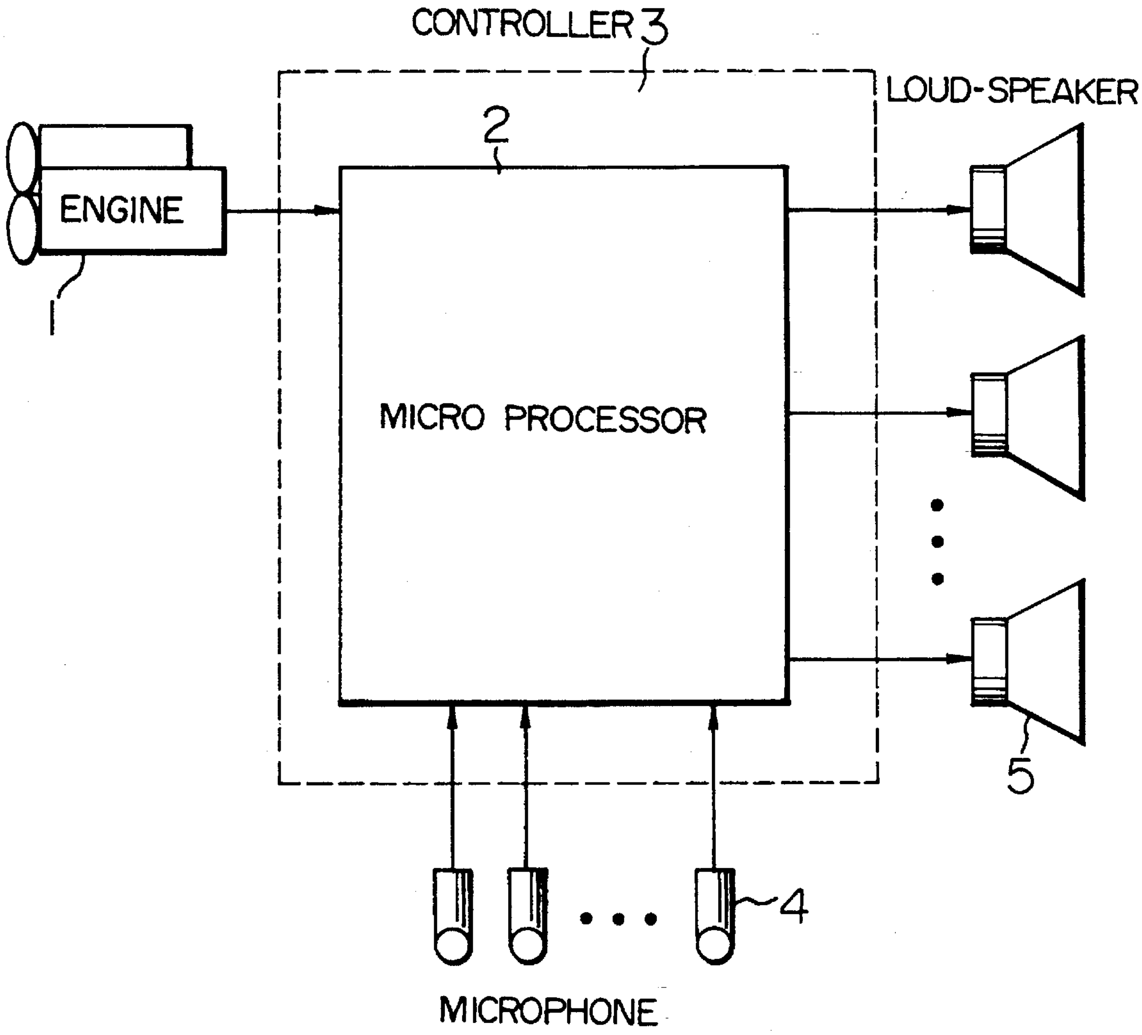
FIG. 1 PRIOR ART
FIG. 1 is a block diagram schematically showing the conventional noise reduction apparatus.
Figure 2:
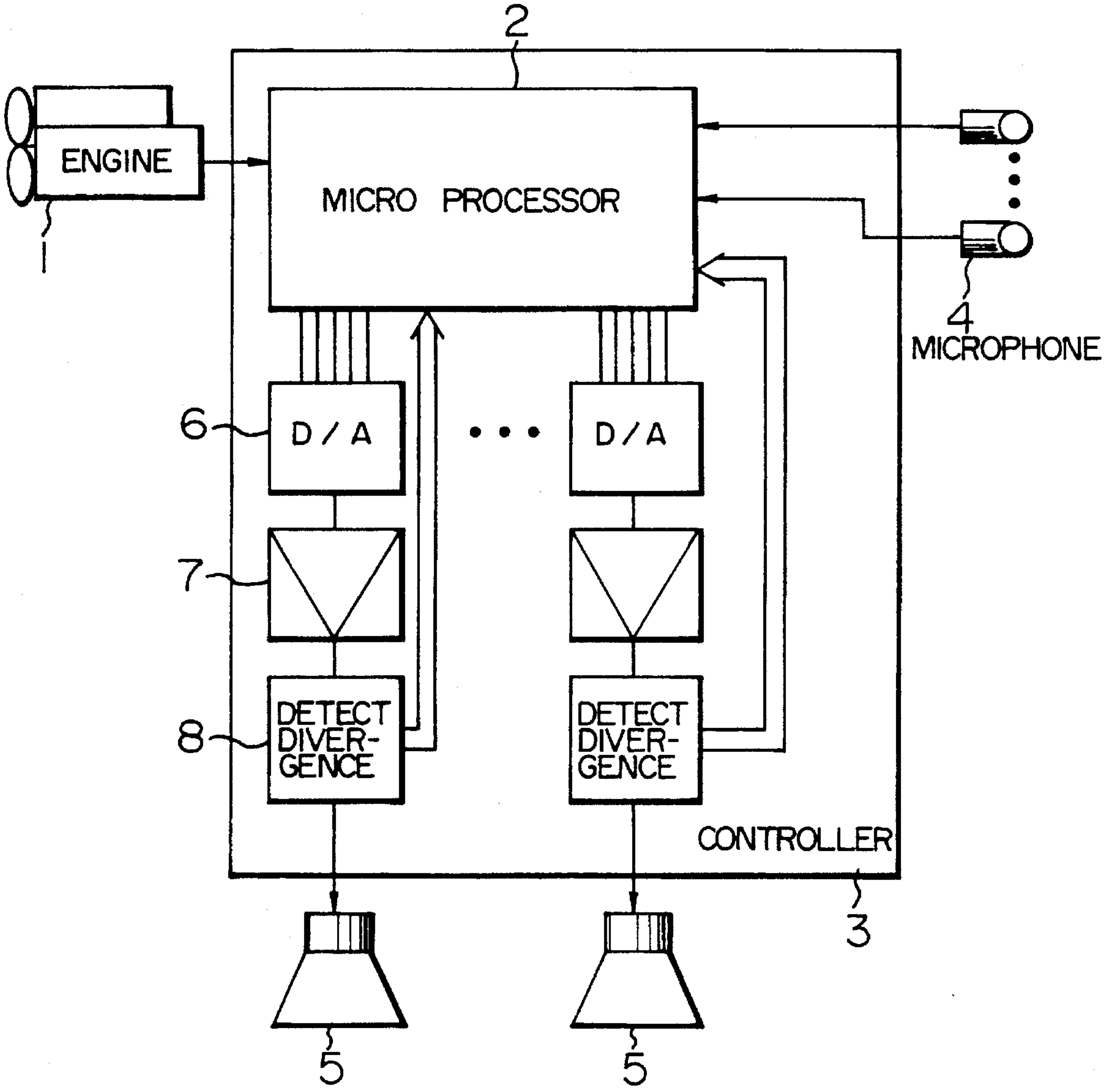
FIG. 2 is a block diagram of one embodiment of the noise reduction apparatus of the invention.

FIG. 2 is a block diagram of the noise reduction apparatus as one embodiment of the invention. The fundamental construction is the same as the conventional one shown in FIG. 1. This noise reduction apparatus shown in FIG. 2 has a plurality of loudspeakers 5 as actuators for generating secondary sound waves, the microphones 4 for detecting the reverberant sound within the noise space, and the controller 3 including the microprocessor 2 as the computing means. The controller 3 also includes D/A converters 6 for converting digital signals as computed signals from the microprocessor 2 into analog signals, and power amplifiers 7 for amplifying the analog signals. In addition, according to this embodiment, this controller includes divergence detection circuits 8 which are provided midway on the paths of the secondary sound signals between the power amplifiers 7 and the loudspeakers 5. When the divergence detection circuits 8 detect a divergence, they supply a function-stop signal to the microprocessor 2 so that the secondary sound signals are prevented from being supplied from the power amplifiers 7 to the loudspeakers 5.

Figure 5:
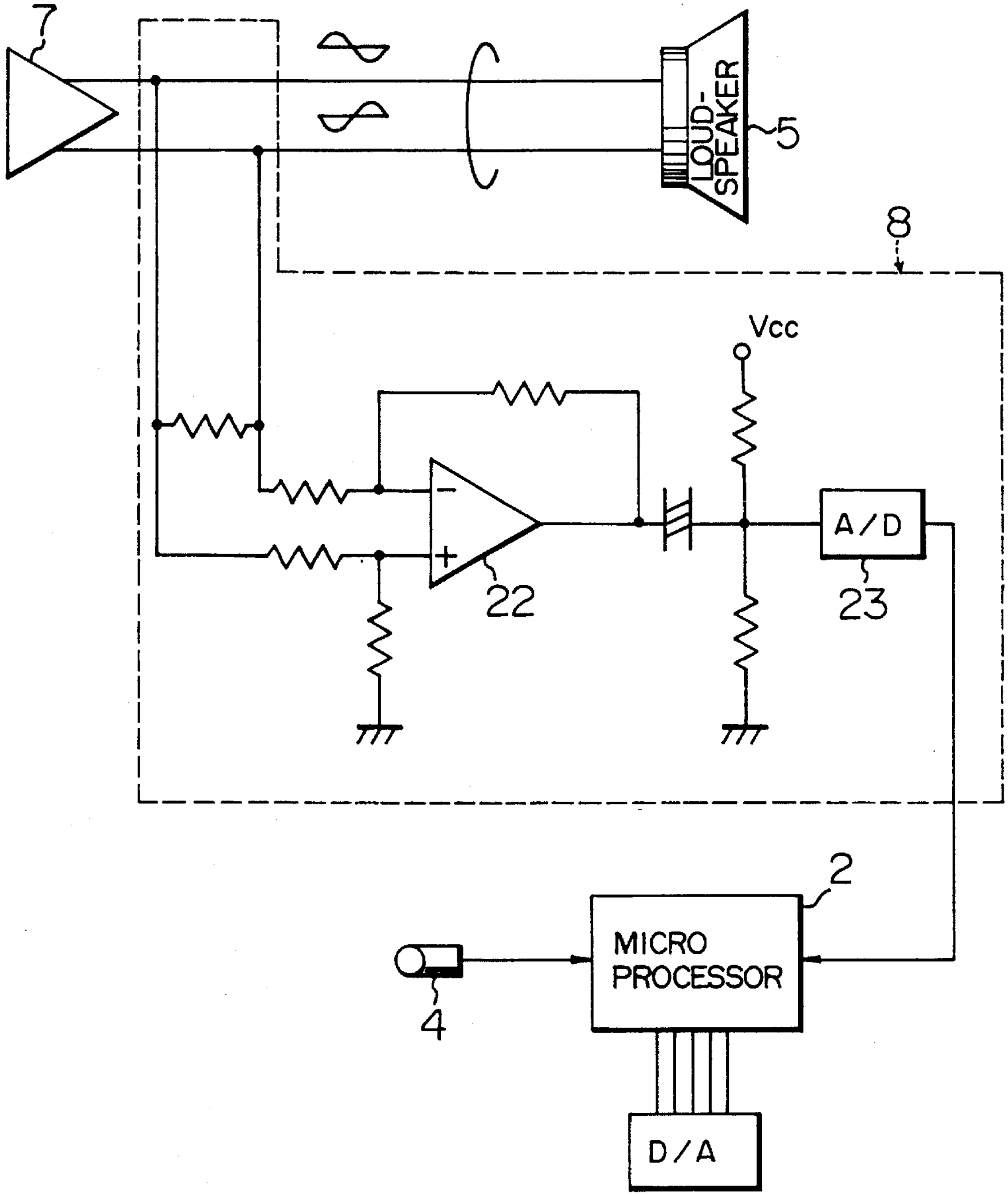
FIG. 5 is a block diagram showing the detailed construction of a divergence detection circuit in the embodiment shown in FIG. 2.

FIG. 5 is a detailed construction diagram of one of the divergence detection circuits 8. The divergence detection circuit 8 has a differential amplifier 22 for amplifying the potential difference between the AC voltage signals which are produced from the power amplifier 7 and which drive the voice coil (not shown) within the loudspeaker 5, and an A/D converter 23 for producing a digital voltage proportional to the value of the peak voltage of the amplified signal and supplying it to the microprocessor 2.

The microprocessor 2 detects the frequency of the mechanical vibration of the engine from a crank angle pulse signal indicative of the revolution frequency of the engine 1 and calculates the secondary sound which is equal in amplitude but opposite in phase to the noise within the noise space, from the spatial acoustic transfer characteristics between the microphone 4 and the loudspeakers 5 within the noise space, and the above-given mechanical vibration frequency. The calculated secondary sound signal, or digital signal, is converted by the D/A converter 6 into an analog signal, which is amplified by the power amplifier 7 and emanated as secondary sound from the loudspeaker 5 to within the noise space. This secondary sound interferes with the noise so as to reduce the noise. During the normal operation of the above-mentioned noise reduction function, the reverberant sound within the noise space is less changed. In other words, the generated noise is stabilized at a certain level, and thus the secondary sound for reducing this noise is also stabilized at a level. The divergence detection circuit 8 monitors the level of the secondary sound signal produced from the power amplifier 7 while comparing it with the value of the above-mentioned digital voltage. When the secondary sound signal level is kept within a predetermined range, the secondary sound signal is directly supplied to the loudspeaker 5 so that the secondary sound is continuously emanated from the loudspeaker to within the noise space in order to reduce the noise.

When this noise reduction apparatus is provided on, for example, an automobile and operated to reduce the noise which is generated within the cabin (passenger compartment) by the vibration of the engine, the spatial acoustic transfer characteristics of the cabin are changed. When the temperature is suddenly changed, the spatial acoustic transfer characteristics of the cabin are also changed. If the change of the spatial acoustic transfer characteristics is large, the amplitude and phase of the secondary sound calculated by the microprocessor 2 are shifted from the original relation with the noise, or from the same amplitude and opposite phase, with the result that the noise is reversely amplified (, or caused to diverge) by the secondary sound emanation. In this case, the secondary sound must be stopped from emanating so that the noise can be suppressed from being amplified. In order to automatically stop the emanation of the secondary sound, it is necessary to detect that the amplitude and phase of the secondary sound has been shifted from the original relation with the noise, or from the equal amplitude and opposite phase relative to the noise. This embodiment considers that as described above, when the noise reduction function is normally operated, the secondary sound signal level is kept stable, and that under an abnormal state, or when the noise is increased, the secondary sound calculated so as to reduce the noise is increased in its amplitude. According to this embodiment, when the divergence detection circuit 8 which monitors the amplitude of the secondary sound signal produced from the power amplifier 7 detects from the output signal from the A/D converter 23 shown in FIG. 5 that the amplitude of the secondary sound signal has greatly increased to shift out of a predetermined range, the secondary sound is automatically stopped from emanating from the loudspeaker 5. The stopping of the secondary sound is realized by stopping part of the function of the microprocessor 2. The part of the function of the microprocessor 2 is stopped by, for example, processing the secondary sound output not to be written in the D/A converter. By stopping the secondary sound emanation, it is possible to maintain only the original noise within the cabin, thus preventing the crew-members (passengers) or others from being annoyed by the increase of the noise. When the secondary sound signal is restored to within the normal, predetermined range, the divergence detection circuit 8 permits the output from the power amplifier 7 to be supplied to the loudspeaker 5, thereby making it possible to resume the noise reduction function. In other words, the secondary sound is interrupted, but when the secondary sound has returned to within the normal range, the divergence detecting circuit 8 permits the output from the power amplifier 7 to be supplied to the loudspeaker 5, causing the noise reduction function to be resumed.

Figure 6:
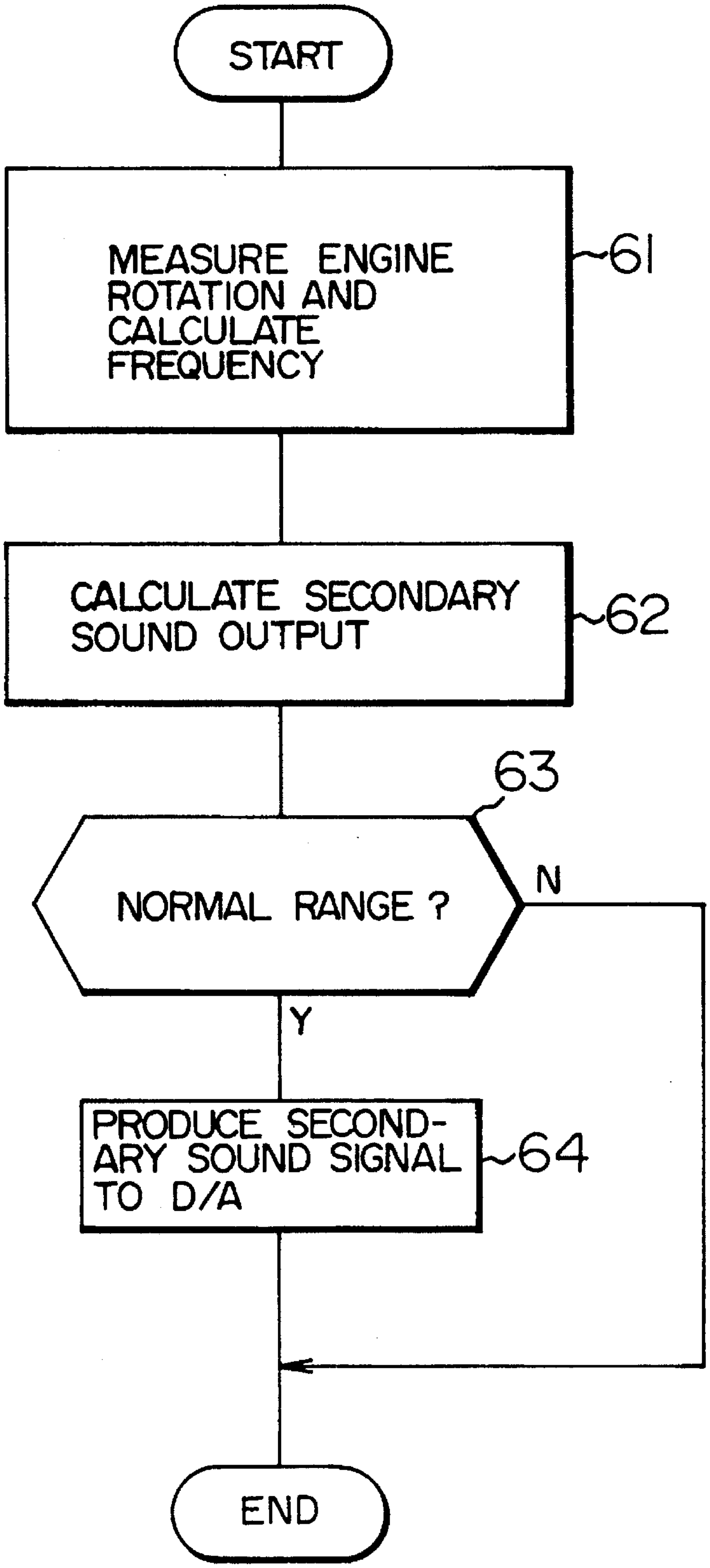
FIG. 6 is a flowchart of the operation of the microprocessor in the embodiment shown in FIG. 2.

FIG. 6 is a flowchart showing the operation of the microprocessor 2. At step 61, an engine rotation signal is supplied to, for example, the interrupt terminal of the microprocessor 2, and the microprocessor calculates the engine rotation period and the reciprocal, or the frequency on the basis of the time lapse from this interruption to the next interruption. At step 62, the secondary sound of equal amplitude and opposite phase is calculated on the basis of the frequency signal. At step 63, a decision is made of whether the value of the secondary sound is within the normal range. If it is within the normal range, at the next step 64, the secondary sound signal is supplied to the D/A converter 6. If it is out of the normal range, one-cycle processing of the flowchart ends.

Figure 3:
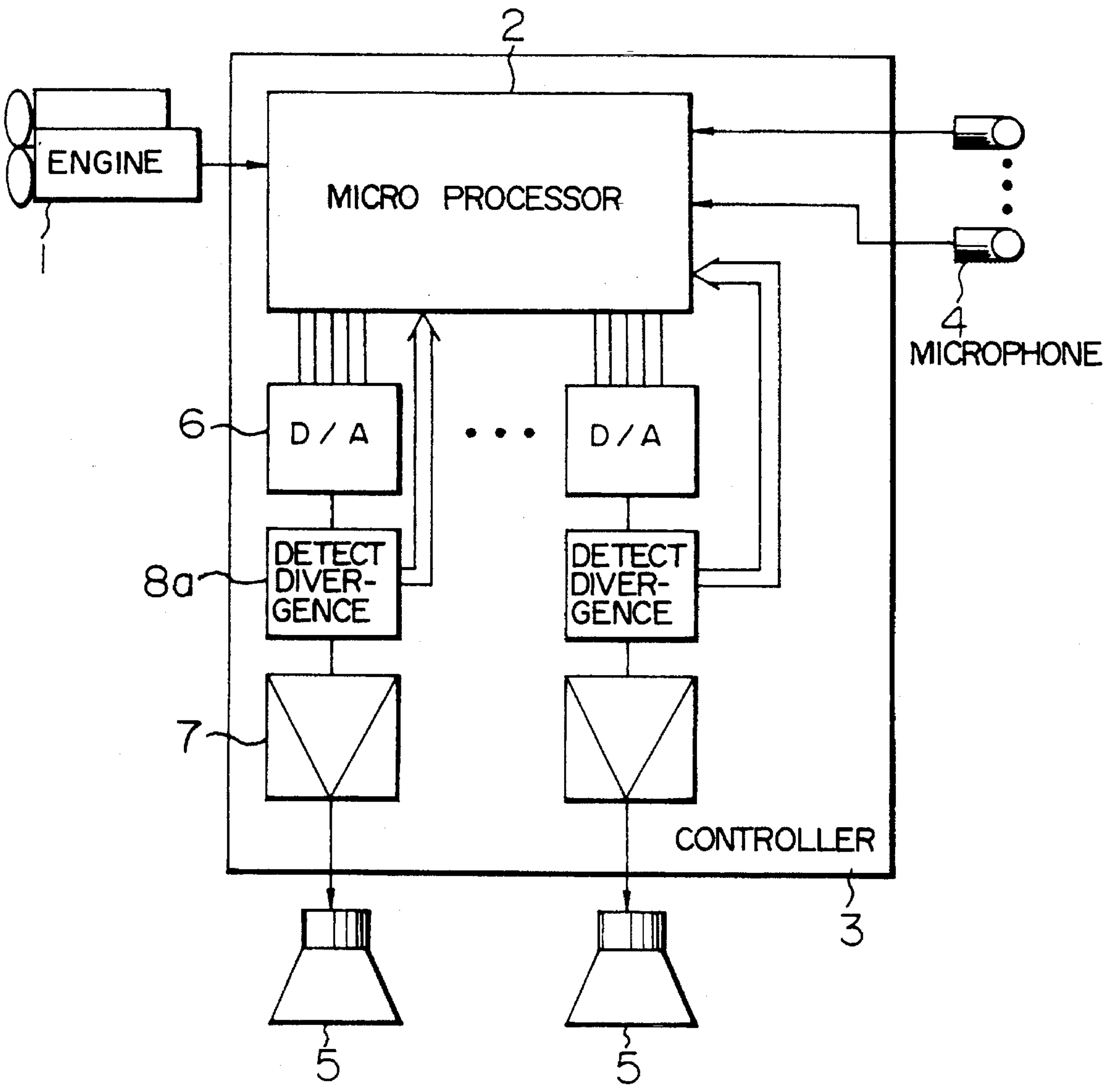
FIG. 3 is a block diagram of another embodiment of the noise reduction apparatus of the invention.
Figure 7:
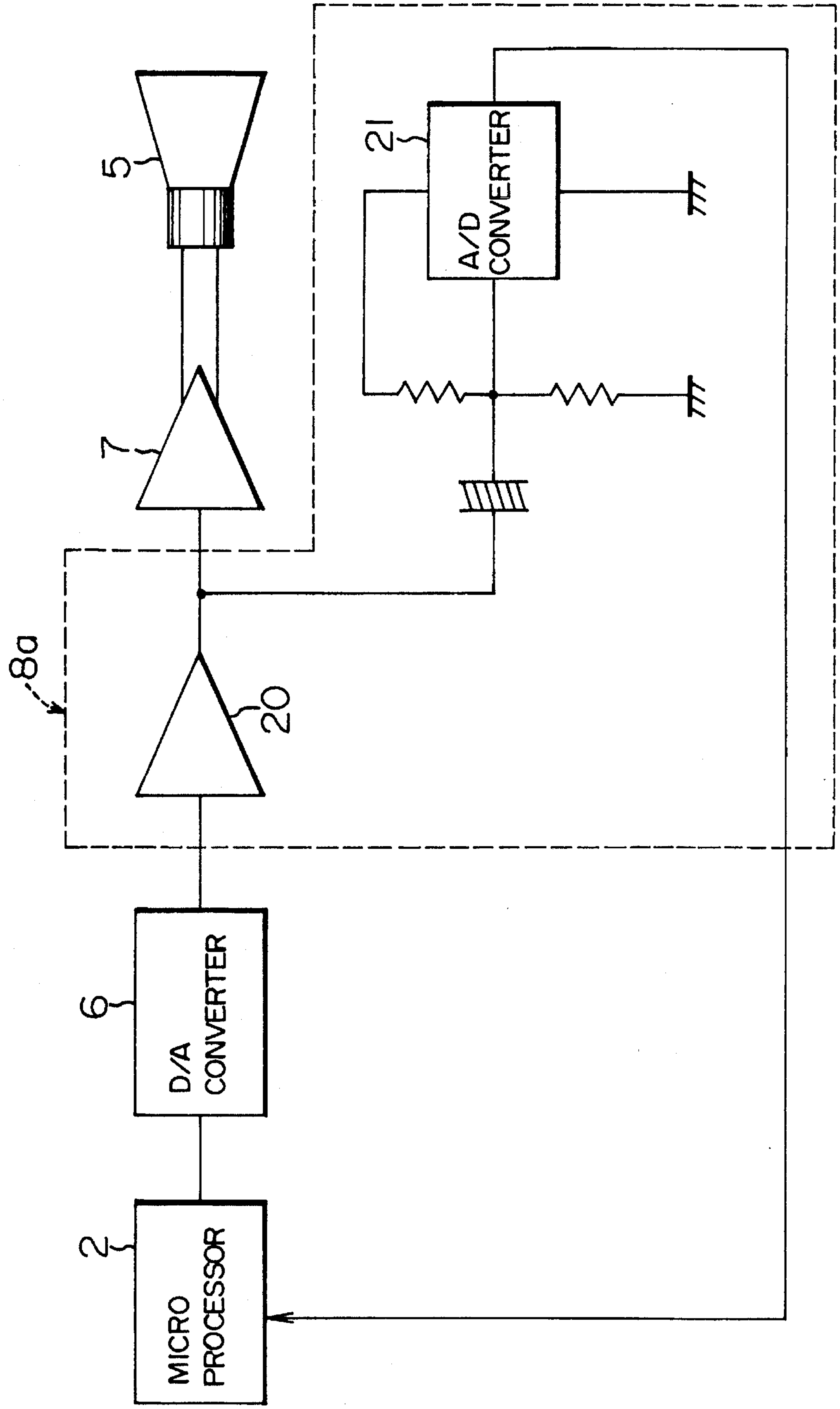
FIG. 7 is a block diagram showing the detailed construction of the divergence detection circuit in the embodiment shown in FIG. 3.

FIG. 3 is a block diagram of another noise reduction apparatus as the second embodiment of the invention. This embodiment is different from the first embodiment in the following point. While the first embodiment has the divergence detection circuit 8 provided between the power amplifier 7 and the loudspeaker 5, the second embodiment has a divergence detection circuit 8*a* provided between the D/A converter 6 and the power amplifier 7. FIG. 7 shows a detailed circuit construction of the divergence detection circuit 8*a*. This divergence detection circuit 8*a* has a buffer amplifier 20 provided for the impedance matching, and an A/D converter 21 provided to convert the output signal from the buffer amplifier 20 into a digital voltage which is then fed back to the microprocessor 2. This second embodiment can obtain the same effect as the first embodiment.

Figure 4:
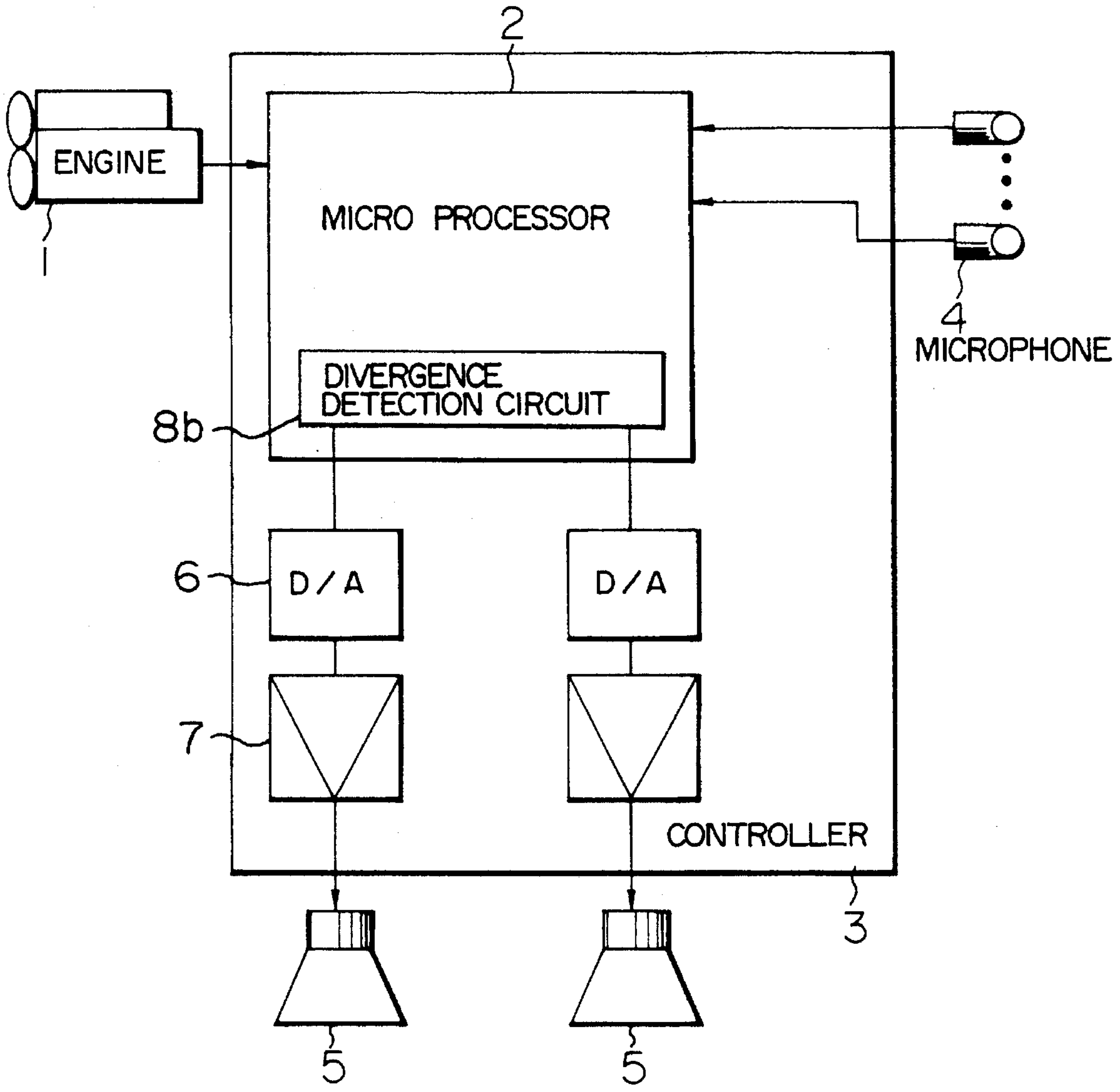
FIG. 4 is a block diagram of still another embodiment of the noise reduction apparatus of the invention.

FIG. 4 is a block diagram of still another noise reduction apparatus as the third embodiment of the invention. Although the embodiments shown in FIGS. 2 and 3 decide whether the secondary sound signal has remarkably increased or not, from the level of the analog signal, this third embodiment is different from those embodiments only in that a divergence detection circuit 8*b* for making this decision from the output signal fed from the microprocessor 2 to the D/A converter 6, or from the value of the digital signal is provided within the microprocessor 2. This third embodiment can also achieve the same effect as the first and second embodiments.

According to this invention, when the noise tends to be reversely increased by the secondary sound emanation, the secondary sound emanation is automatically interrupted before the noise is remarkably increased, so that the noise reduction can be always performed satisfactorily.

We claim:

1. A noise reduction apparatus comprising:

noise detection means for detecting noise generated by propagation of a mechanical vibration;

a digital computer for calculating secondary sound having an opposite phase relative to said noise from frequency of said mechanical vibration;

a digital to analog converter for converting a digital signal of said secondary sound calculated by said digital computer into an analog signal;

a power amplifier for amplifying said analog signal produced from said digital to analog converter;

secondary sound generating means for generating secondary sound according to said analog signal amplified by said power amplifier and thereby cancelling out said noise to reduce said noise; and divergence detection means for monitoring magnitude of said digital signal, and for automatically interrupting generation of said secondary sound from the said secondary sound generating means when said magnitude of said digital signal is outside of a predetermined range, and resuming generating of said secondary sound when said magnitude of said digital signal returns to within said predetermined range.

2. A noise reduction apparatus according to claim 1, wherein said divergence detection means automatically interrupts the generation of secondary sound from the secondary sound generating means by stopping the function of said digital computer.

3. A noise reduction apparatus comprising:

noise detection means for detecting noise generated by propagation of a mechanical vibration;

a digital computer for calculating secondary sound having an opposite phase relative to said noise from frequency of said mechanical vibration;

a digital to analog converter for converting a digital signal of said secondary sound calculated by said digital computer into an analog signal;

a power amplifier for amplifying said analog signal produced from said digital to analog converter;

secondary sound generating means for generating secondary sound according to said analog signal amplified by said power amplifier and thereby cancelling out said noise to reduce said noise; and divergence detection means for monitoring magnitude of said analog signal produced from said digital to analog converter, and for automatically interrupting generation of said secondary sound from said secondary sound generating means when said magnitude of said analog signal produced from said digital to analog converter is outside of a predetermined range, and resuming generation of said secondary sound when said magnitude of said analog signal produced from said digital to analog converter returns to within said predetermined range.

4. A noise reduction apparatus according to claim 3, wherein said divergence detection means automatically interrupts the generation of secondary sound from the secondary sound generating means by stopping the function of said digital computer.

5. A noise reduction apparatus comprising:

noise detection means for detecting noise generated by propagation of a mechanical vibration;

a digital computer for calculating secondary sound having an opposite phase relative to said noise from frequency of said mechanical vibration;

a digital to analog converter for converting a digital signal of said secondary sound calculated by said digital computer into an analog signal;

a power amplifier for amplifying said analog signal produced from said digital to analog converter;

secondary sound generating means for generating secondary sound according to said analog signal amplified by said power amplifier and thereby cancelling out said noise to reduce said noise; and divergence detection means for monitoring magnitude of said analog signal produced from said amplifier, and for automatically interrupting generation of said secondary sound from said secondary sound generating means when said magnitude of said analog signal produced from said power amplifier is outside of a predetermined range, and resuming generation of said secondary sound when said magnitude of said analog signal produced form said mower amplifier returns to within said predetermined range.

6. A noise reduction apparatus according to claim 5, wherein said divergence detection means automatically interrupts the generation of secondary sound from the secondary sound generating means by stopping the function of said digital computer.

7. Method for reducing ambient noise generated by a mechanical vibration, said method comprising the steps of:

detecting said ambient noise generated by said mechanical vibration;

detecting frequency of said mechanical vibration and calculating a secondary sound signal in a digital computer, said secondary sound signal having phase opposite to phase of said ambient noise, based on a frequency of said mechanical vibration;

generating secondary sound waves in response to said secondary sound signal, said secondary sound waves interfering with said ambient noise to reduce magnitude of said ambient noise;

detecting magnitude of said secondary sound signal and comprising said secondary sound signal with a predetermined magnitude range;

interrupting generation of said secondary sound waves when said secondary sound signal has a magnitude which exceeds said predetermined range; and resuming generation of said secondary sound waves when said magnitude of said secondary sound signal reenters said predetermined range.

8. Method according to claim 7, wherein said step of generating secondary sound waves comprises:

converting said secondary sound signal calculated in said digital computer to an analog secondary sound signal;

amplifying said analog secondary sound signal to generate an amplified secondary sound signal; and using a secondary sound transducer to generate said secondary sound waves in response to said analog secondary sound signal.

9. Method according to claim 8, wherein said step of detecting magnitude of said secondary sound signal comprises detecting magnitude of said amplified secondary sound signal.

10. Method according to claim 8, wherein said step of detecting magnitude of said secondary sound signal comprises detecting magnitude of said analog secondary sound signal.

11. Method according to claim 8, wherein said step of detecting magnitude of said secondary sound signal comprises detecting magnitude of said secondary sound signal before said converting step.

* * * * *